United States Patent [19]

Itamoto et al.

[11] Patent Number: 4,597,569
[45] Date of Patent: Jul. 1, 1986

[54] ATTRACTION HOLDING DEVICE

[75] Inventors: Shigeru Itamoto; Kiyoshi Suzuki; Kenji Yasuda, all of Oomiya, Japan

[73] Assignee: Fuji Photo Optical Co., Ltd., Saitama, Japan

[21] Appl. No.: 688,011

[22] Filed: Dec. 31, 1984

[30] Foreign Application Priority Data

Jan. 10, 1984 [JP] Japan .................. 59-1548

[51] Int. Cl.$^4$ ............................. B25B 11/00
[52] U.S. Cl. ......................... 269/21; 269/22
[58] Field of Search ............. 269/21, 22, 902; 51/235; 279/3 R; 248/362, 363

[56] References Cited

U.S. PATENT DOCUMENTS

| 477,304 | 6/1892 | Marsh | 269/21 |
| 1,823,537 | 9/1931 | Gavdreau | 269/902 |
| 3,851,758 | 12/1974 | Makhijani et al. | 269/21 |
| 3,971,552 | 7/1976 | Mayfield | 269/902 |
| 4,428,815 | 1/1984 | Powell et al. | 269/21 |
| 4,541,717 | 9/1985 | Itamoto et al. | |

FOREIGN PATENT DOCUMENTS 59-85987  6/1984  Japan .

Primary Examiner—Robert C. Watson
Attorney, Agent, or Firm—Parkhurst & Oliff

[57] ABSTRACT

A device for attraction holding a measurement object in an interferometer comprises a holding surface having holes and an air chamber communicating with the holes through suction passages formed between the holding surface and air chamber so as to attract and hold an object on the holding surface by exhausting the air from the air chamber. The air chamber is sealed by at least one flexible member which is deformed when an excessive negative pressure is established in the air chamber, so as to prevent distort or deformation of the holding surface, and hence the object held thereon.

7 Claims, 3 Drawing Figures

ATTRACTION HOLDING DEVICE

BACKGROUND OF THE INVENTION

1. Field of the Invention

This invention relates to an attraction holding device for accurately holding a measurement object in an interferometer or the like.

2. Description of the Prior Art

Interferometers such as flatness testers for measuring the surface flatness of measurement objects are used for inspecting the surface flatness of silicon wafers used as a substrate of an integrated circuit prior to the manufacturing process of integrated circuits. To make accurate measurements, it is necessary to fix the measurement object on the stage of the interferometer without any distortion induced. Also when the surface of objects must be processed or machined precisely, it is required to securely hold the object without distorting or deforming the objects.

In order to satisfy the aforesaid requirements, there has heretofore been used a method in which the measurement object is held by attraction on a reference plane exhibiting a high flatness. Specifically, the measurement object is placed on the reference plane with suction holes perforated therethrough, and then the object is attracted by an evacuation with a vacuum pump through the suction holes, being securely held on the reference plane.

In such method as described above, it is important not only to process or machine the surface of the reference plane for holding the object to a flatness of the order of light wavelengths but also not to have the reference plane distorted or deformed when holding the object thereon. In case the object is held by an evacuation on the reference plane, there arises an air pressure gradient between the inside and outside of the reference plane. For this reason, when constructing attraction holding devices including the reference planes, it must be noted that distortions or deformations attributable to the air pressure gradient will be established in the reference plane.

Heretofore, although careful consideration has been given from the point of view of accurately machining and securely mounting the reference plane, there has not been thorough enough study of a manner of maintaining the accuracy of the surface of the reference plane on which the object is held by evacuation.

SUMMARY OF THE INVENTION

The present invention has as its object the provision of an attraction holding device in which no distortion or deformation is established in a reference plane, and hence an object, when the object is held on the reference plane by an evacuation.

To accomplish the above-described object, the present invention contemplates that a flexible plate or film member is provided as means for absorbing any excess pressure, so that the reference plane is not susceptible to an air pressure gradient arising between the inside and outside of the reference plane.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

DETAILED DESCRIPTION OF THE INVENTION

Description will hereafter be given of the preferred embodiments of an attraction holding device according to the present invention with reference to the accompanying drawings.

Figure 1:
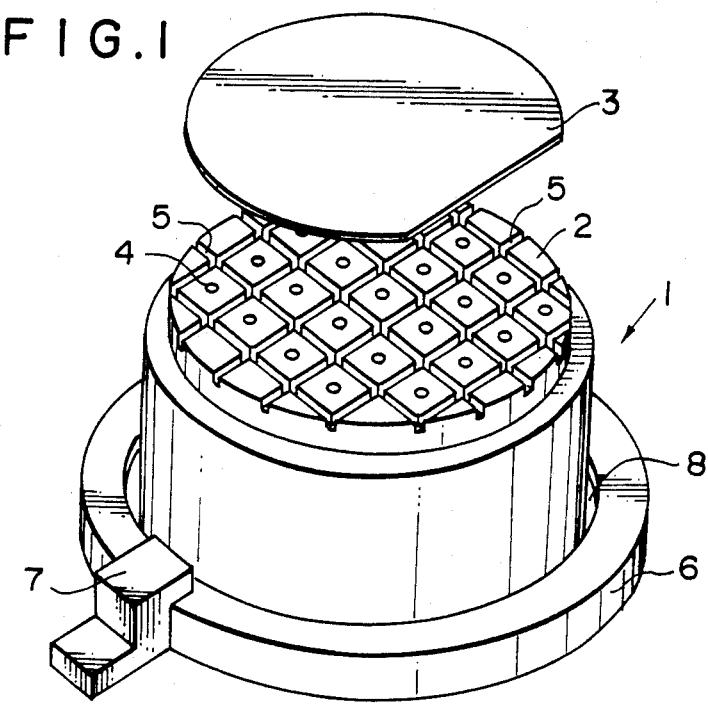
FIG. 1 is a perspective view showing an embodiment of the attraction holding device in accordance with the present invention.
Figure 2:
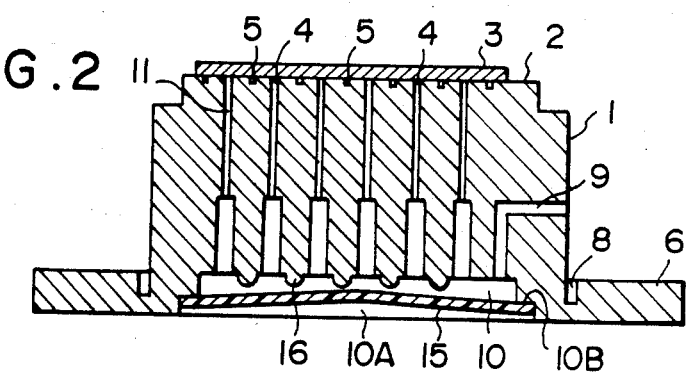
FIG. 2 is a vertical cross-sectional view showing the embodiment of FIG. 1.

FIGS. 1 and 2 illustrate one embodiment according to the present invention.

As shown in FIGS. 1 and 2, the attraction holding device is, for the most part, integrally constructed from a pedestal 1 generally having a cylindrical shape made of materials, for example quartz, having an extremely low thermal expansibility. The pedestal 1 has an upper surface 2 which is polished to a high flatness and smoothness so as to be appropriate for a reference plane. The upper surface 2 is provided with a plurality of suction holes 4 distributed approximately uniformly and grooves 5 laid out at right angles in such a way that each segment includes a suction hole 4. The cylindrical pedestal 1 at the bottom side has an annular flange 6 which is held in place by means of a suitable number of hooks 7, thereby fixing the cylindrical pedestal 1 onto a measuring table or stage (not shown). The fixation of the cylindrical pedestal 1 by the hooks 7 which exert vertically a force on the flange 6 provided apart from the upper surface 2, namely the reference surface, shows such effect as to avoid a stress from extending to the upper surface 2. This effect is remarkable in the case of the provision of an annular groove 8 inside the flange 6.

Inside the bottom of the pedestal 1 there is provided an air chamber 10 which is communicated with an exhaust passage 9 for connection with a vacuum pump (not shown), and is communicated with the suction holes 4 through suction passages 11. The air chamber 10 has, at its bottom side, an opening 10A provided with a step 10B around the inner peripheral surface. A flexible plate 15 made, for example, of vinyl chloride, plastics or the like is received in the step 10B and should preferably be bonded to the step 10B for closing the opening 10A to keep the air chamber 10 airtight. An elastic modulus of the flexible plate 15 is determined so as to avoid distortion or deformation the wafer 3 and the surface 2, when the air chamber 10 is sucked through the exhaust passage 9.

The function of the attraction holding device described above is as follows.

When the attraction holding device is used, that is when an object such as a silicon wafer 3 is placed on the upper surface 2 as a reference plane, a vacuum pump (not shown) connected to the exhaust passage 9 is started to reduce the pressure in the air chamber 10, making it negative. As a result of the negative pressure, the wafer 3 is attracted and held on the upper surface 2 by atmospheric pressure. As pressure is reduced, the pedestal 1, specifically the upper surface 2 is subjected to vertically downward force which acts to distort the upper surface 2. In spite of being subjected to a vertically downward force, however, there is no distortion or deformation of the upper surface 2 of the attraction holding device according to the present invention, or the wafer 3 held thereon by attraction, because of the fact that the flexible plate 15 will be deformed when a negative pressure is established in the air chamber 10. Therefore, accurate measurements can be carried out.

For attracting and holding the wafer 3 on the upper surface 2, it is desirable to keep the suction chamber 10 at a constant negative pressure.

When removing the wafer 3 from the upper surface 2 of the pedestabl 1 following the measurement, less force is required because of the provision of the grooves 5 in the upper surface 2. For easy removal of the wafer 3 from the upper surface 2, it is preferable to send air into the air chamber 10 before removing the wafer 3.

As can be seen from FIG. 2, projections 16 provided on the upper surface of the air chamber 10 act on the flexible plate 15 so that the flexible plate 15 does not block the suction passages 11 when being deformed.

Figure 3:
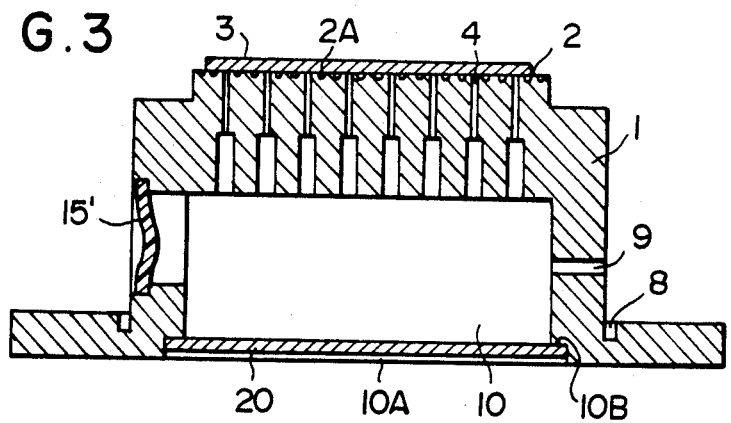
FIG. 3 is a vertical cross-sectional view showing another embodiment of the attraction device in accordance with the present invention.

Referring now to FIG. 3, such figure illustrates another embodiment of an attraction holding device according to the present invention, there being provided a flexible plate 15 inside the side wall of the pedestal 1, that is a different point in construction from the above-described embodiment of FIG. 2. In this case, it is not always necessary to use a flexible plate as a bottom plate 20 for closing the opening 10A of the air chamber 10 to keep the air chamber air-tight. The upper surface 2 may be a porous layer by providing recesses 2A thereon in place of grooves 5 (seen in FIG. 2). The number of flexible plates 15 is not limited to only one. When the pedestal 1 is made of a polyhedron, for example, a square column, four flexible plates 15′ should preferably be provided, one for every side wall of the suction chamber 10.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. An attraction holding device comprising:
   a body having a plurality of suction passages;
   a holding surface, adapted to hold an object thereon, having a plurality of holes communicating with said suction passages;
   an air chamber communicating with said holes through said suction passages so as to attract said object by said holes; and
   at least one flexible member airtightly defining said air chamber so as to control negative pressure within said air chamber.

2. An attraction holding device as set forth in claim 1, wherein said holding surface is provided with recesses or grooves.

3. An attraction holding device as set forth in claim 2, wherein said flexible member is provided at the bottom of said air chamber.

4. An attraction holding device as set forth in claim 2, wherein said device is provided with a plurality of flexible members in a side wall of said device.

5. An attraction holding device as set forth in claim 2, wherein said device further comprises a flange through which said device is fixed.

6. An attraction holding device as set forth in claim 5, wherein said flange is provided with a groove inside said flange.

7. An attraction holding device as set forth in claim 3, wherein said air chamber is provided with projections on an upper surface of said air chamber for preventing said flexible member from blocking said suction passages.

* * * * *